United States Patent
Chen et al.

(10) Patent No.: US 12,040,546 B2
(45) Date of Patent: Jul. 16, 2024

(54) PACKAGING STRUCTURE RADIATING ELECTROMAGNETIC WAVE IN HORIZONTAL DIRECTION AND VERTICAL DIRECTION AND METHOD MAKING THE SAME

(71) Applicant: SJ Semiconductor(Jiangyin) Corporation, Jiangyin (CN)

(72) Inventors: Yenheng Chen, Jiangyin (CN); Chengchung Lin, Jiangyin (CN)

(73) Assignee: SJ Semiconductor(Jiangyin) Corporation, Jiangyin (CN)

( * ) Notice: Subject to any disclaimer, the term of this patent is extended or adjusted under 35 U.S.C. 154(b) by 302 days.

(21) Appl. No.: 17/705,121

(22) Filed: Mar. 25, 2022

(65) Prior Publication Data

US 2022/0320748 A1 Oct. 6, 2022

(30) Foreign Application Priority Data

Apr. 6, 2021 (CN) .......................... 202110367864.7
Apr. 6, 2021 (CN) .......................... 202120692595.7

(51) Int. Cl.
*H01L 23/498* (2006.01)
*H01L 21/48* (2006.01)
*H01L 23/00* (2006.01)
*H01Q 21/00* (2006.01)
*H01Q 21/06* (2006.01)

(52) U.S. Cl.
CPC ..... *H01Q 21/0087* (2013.01); *H01L 21/4857* (2013.01); *H01L 23/49822* (2013.01); *H01L 24/16* (2013.01); *H01Q 21/061* (2013.01); *H01L 2224/16225* (2013.01)

(58) Field of Classification Search
None
See application file for complete search history.

(56) References Cited

U.S. PATENT DOCUMENTS

| 10,867,938 B2 * | 12/2020 | Tang | H01L 24/19 |
| 2018/0158787 A1 * | 6/2018 | Chang | H01L 23/49822 |
| 2019/0103653 A1 * | 4/2019 | Jeong | H01L 23/645 |

* cited by examiner

*Primary Examiner* — Hung K Vu
(74) *Attorney, Agent, or Firm* — IPRTOP LLC (57) ABSTRACT

The present disclosure provides an antenna packaging structure radiating e-m waves in a horizontal direction and a vertical direction and a method making the same. The method includes: providing a support substrate, forming a separation layer on a surface of the support substrate; forming a rewiring layer on the separation layer; forming an antenna array layer on the rewiring layer, the antenna array layer is electrically connected to the metal wire layer; the antenna array layer includes first antennas and second antennas arranged in an array respectively, radiating e-m waves in the horizontal direction and the vertical direction respectively; forming a molding material layer; removing the support substrate and the separation layer; forming solder ball bumps on a surface of the rewiring layer away from the antenna array layer, the solder ball bumps are electrically connected to the metal wire layer; disposing a chip on the solder ball bumps.

10 Claims, 4 Drawing Sheets

PACKAGING STRUCTURE RADIATING ELECTROMAGNETIC WAVE IN HORIZONTAL DIRECTION AND VERTICAL DIRECTION AND METHOD MAKING THE SAME

CROSS REFERENCE TO RELATED APPLICATION

The present application claims the benefit of priority to Chinese Patent Application No. CN2021103678647, entitled "Antenna Packaging Structure Radiating Electromagnetic Wave in Horizontal Direction and Vertical Direction and Method Making the Same", filed with CNIPA on Apr. 6, 2021, and Chinese Patent Application No. CN2021206925957, entitled "Antenna Packaging Structure Radiating Electromagnetic Wave in Horizontal Direction and Vertical Direction", filed with CNIPA on Apr. 6, 2021, the content of which is incorporated herein by reference in their entireties.

FIELD OF TECHNOLOGY

The present disclosure relates to the technical field of semiconductor packaging, in particular, to an antenna packaging structure radiating electromagnetic waves (e-m waves) in a horizontal direction and a vertical direction and a method making the same.

BACKGROUND

With the advent of the era of 5G communication and artificial intelligence, the amount of data to be transmitted and processed interactively at high speed by chips used in related fields has been increasing, and the demand for mobile Internet and Internet of Things has been tremendous. Miniaturization and multi-functionalization of electronic terminal products are currently the general trend in the industry. How to integrate and package together different types of high-density chips on one small size system with powerful functions at low power consumption has become a major challenge in the field of advanced packaging of semiconductor chips.

Fan-out packaging technology can integrate multiple chips and has better performance than carrier-based system-in-package. The industry is generally optimistic about applying of fan-out packaging technology in the integrated packaging of 5G RF front-end chips in the future. Fan-Out Wafer Level Packaging (FOWLP) combines the advantages of fan-out packaging and wafer-level packaging technology, can fully meet users' needs for multi-function, high performance, high energy efficiency, low cost and small size of electronic devices, and has emerged as one of the most promising packaging technologies to meet the needs of electronic devices for mobile and network applications.

In order to further reduce the device area, the antenna has been integrated into the fan-out wafer-level packaging structure, but in the existing techniques, only the antenna designs in the vertical radiation direction are usually adopted. Due to the process limit of the molding thickness, the design of the antenna is more difficult than ever, which hinders the further miniaturization of the device.

SUMMARY

The present disclosure provides an antenna packaging structure radiating e-m waves in both a horizontal direction and a vertical direction and a method making the same, to solve the problem of the antenna design that the traditional fan-out package structures which only enable radiation in the vertical direction, and due to the process limit of the molding thickness, the design of the antenna is more difficult.

The method includes: providing a support substrate placed in the horizontal direction, and forming a separation layer on the support substrate; forming a rewiring layer on the separation layer, the rewiring layer includes a dielectric layer and a metal wire layer placed in the dielectric layer and on a surface of the dielectric layer; forming an antenna array layer on the rewiring layer, the antenna array layer is electrically connected to the metal wire layer; the antenna array layer includes a plurality of first antennas and a plurality of second antennas, the plurality of first antennas and the plurality of second antennas are respectively arranged in an array; the plurality of first antennas radiates in the horizontal direction, and the plurality of second antennas radiates in the vertical direction; the plurality of first antennas includes a plurality of first metal sheets extending along a first direction and a plurality of second metal sheets extending along a second direction, the first direction is not parallel to the second direction; the plurality of first metal sheets is arranged with sheets in parallel and spaced by a sheet-to-sheet interval from each other, the plurality of second metal sheets is arranged with sheets in parallel and spaced by a sheet-to-sheet interval from each other, and two ends of each of the plurality of second metal sheets are respectively connected to the plurality of first metal sheets; each of the plurality of second antennas includes a third metal sheet and a metal column, the metal column extends vertically, the third metal sheet is located on a top of the metal column, and a radiating surface of the third metal sheet is parallel to a horizontal plane; forming a molding material layer, the molding material layer molds the antenna array layer; removing the support substrate and the separation layer; forming solder ball bumps on a surface of the rewiring layer away from the antenna array layer, the solder ball bumps are electrically connected to the metal wire layer; and disposing a chip on the solder ball bumps.

Optionally, after removing the support substrate and the separation layer, the method further includes: forming openings in the dielectric layer, the openings exposing the metal wire layer, and forming the solder ball bumps in the openings.

Optionally, two of the plurality of first metal sheets and two of the plurality of second metal sheets are provided in the antenna array layer, and the first direction is perpendicular to the second direction.

Optionally, the support substrate includes a glass substrate; the separation layer includes a release layer and a protective layer, the release layer is formed on a surface of the support substrate, and the protective layer is formed on a surface of the release layer facing away from the support substrate; the release layer includes one or more of a carbon material layer, a resin material layer, and an organic material layer, and the protective layer includes a polyimide layer.

Optionally, after the rewiring layer is formed, the method further includes: forming an under bump metallurgy (UBM) layer on the surface of the rewiring layer, the UBM layer is electrically connected to the metal wire layer, and the antenna array layer is formed on a surface of the UBM layer and is electrically connected to the UBM layer.

The present disclosure further provides an antenna packaging structure radiating e-m waves in a horizontal direction and a vertical direction. The antenna packaging structure radiating e-m waves in a horizontal direction and a vertical direction includes: a rewiring layer, an antenna array layer, a molding material layer, solder ball bumps, and a chip.

The rewiring layer includes a first surface and a second surface opposite to the first surface, and the rewiring layer includes a dielectric layer and a metal wire layer placed in the dielectric layer and on a surface of the dielectric layer.

The antenna array layer is placed on the first surface of the rewiring layer, the antenna array layer is electrically connected to the metal wire layer. The antenna array layer includes a plurality of first antennas and a plurality of second antennas, the plurality of first antennas and the plurality of second antennas are respectively arranged in an array. The plurality of first antennas radiates in the horizontal direction, and the plurality of second antennas radiates in the vertical direction. The plurality of first antennas includes a plurality of first metal sheets extending along a first direction and a plurality of second metal sheets extending along a second direction, the first direction is not parallel to the second direction. The plurality of first metal sheets is arranged with sheets in parallel and spaced by a sheet-to-sheet interval from each other, the plurality of second metal sheets is arranged with sheets in parallel and spaced by a sheet-to-sheet interval from each other, and two ends of each of the plurality of second metal sheets are respectively connected to the plurality of first metal sheets. Each of the plurality of second antennas includes a third metal sheet and a metal column, the metal column extends vertically, the third metal sheet is located on a top of the metal column, and a radiating surface of the third metal sheet is parallel to the horizontal plane.

The molding material layer is placed on the first surface of the rewiring layer and molds the antenna array layer.

The solder ball bumps are placed on the second surface of the rewiring layer and electrically connected to the metal wire layer.

The chip is electrically connected to the solder ball bumps.

Optionally, the antenna packaging structure radiating e-m waves in the horizontal direction and the vertical direction further includes an under bump metallurgy layer, the under bump metallurgy layer is placed on the second surface of the rewiring layer, and two ends of the under bump metallurgy are respectively connected electrically to the metal wiring layer and the solder ball bumps.

Optionally, the antenna packaging structure radiating e-m waves in the horizontal direction and the vertical direction further includes an underfill layer, the underfill layer is placed between the chip and the solder ball bumps.

Optionally, two of the plurality of first metal sheets and two of the plurality of second metal sheets are provided.

Optionally, the first direction is perpendicular to the second direction.

Optionally, the plurality of first antennas is arranged in multiple rows and multiple columns, the plurality of second antennas is arranged in lines between the plurality of first antennas.

In the present disclosure, the antennas radiating e-m waves in the horizontal and the vertical directions are designed at the same time, so that the antennas can radiate along the side and front of the package at the same time, the radiation wavelengths of the antennas can be increased, which can improve the flexibility of antenna design and help improve device performance. Compared with the traditional device with only a vertical radiation direction, the present disclosure can reduce the thickness of the molding material layer under the condition of achieving the same performance, which is conducive to further miniaturization of the device.

DESCRIPTION OF THE REFERENCE NUMERALS

11 Support substrate
12 Release layer
13 Protective layer
14 Dielectric layer
141 Opening
15 Metal wire layer
16 First antenna
161 First metal sheet
162 Second metal sheet
17 molding material layer
18 Solder ball bump
19 Chip
20 Under bump metallurgy layer
21 Second antenna
211 Third metal sheet
212 Metal pillar

DETAILED DESCRIPTION

The implementation mode of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

When describing the embodiments of the present disclosure in detail, for the convenience of description, the cross-sectional views showing the device structure will not be partially enlarged according to the general scale, and the schematic diagrams are only examples, which should not limit the protection scope of the present disclosure. In addition, the three-dimensional spatial dimensions of length, width and depth should be included in the actual production.

For convenience of description, spatially relative terms such as "under," "below," "lower," "down," "above," "on," etc. may be used herein to describe the relationship of an element or a feature to other components or features shown in the drawings. It will be understood that these spatially relative terms are intended to encompass other directions of the device in use or operation than those depicted in the drawings. In addition, when a layer is referred to as being 'between' two layers, it can be the only layer between the two layers, or one or more intervening layers between the two layers. In the present disclosure, when referring to the description of the numerical range, unless otherwise specified, the endpoint values are all included.

In some embodiments of the present disclosure, when a first feature is "on" a second feature, the first feature and the second feature may be formed in direct contact, or additional features may be formed between the first feature and the second feature, in this way, the first feature and the second feature may not be in direct contact.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated.

Traditional fan-out wafer-level packaging antenna structure usually only adopts a single vertical radiation direction design. In order to improve the antenna performance, it is usually necessary to ensure that the antenna has a certain height, and the molding material layer of the molding antenna has to be made thick enough to ensure the complete packaging of the antenna. However, the traditional molding material layer has a limit in the thickness deposition process, which limits the antenna design. Therefore, the present disclosure proposes improvement measures.

Figure 1:
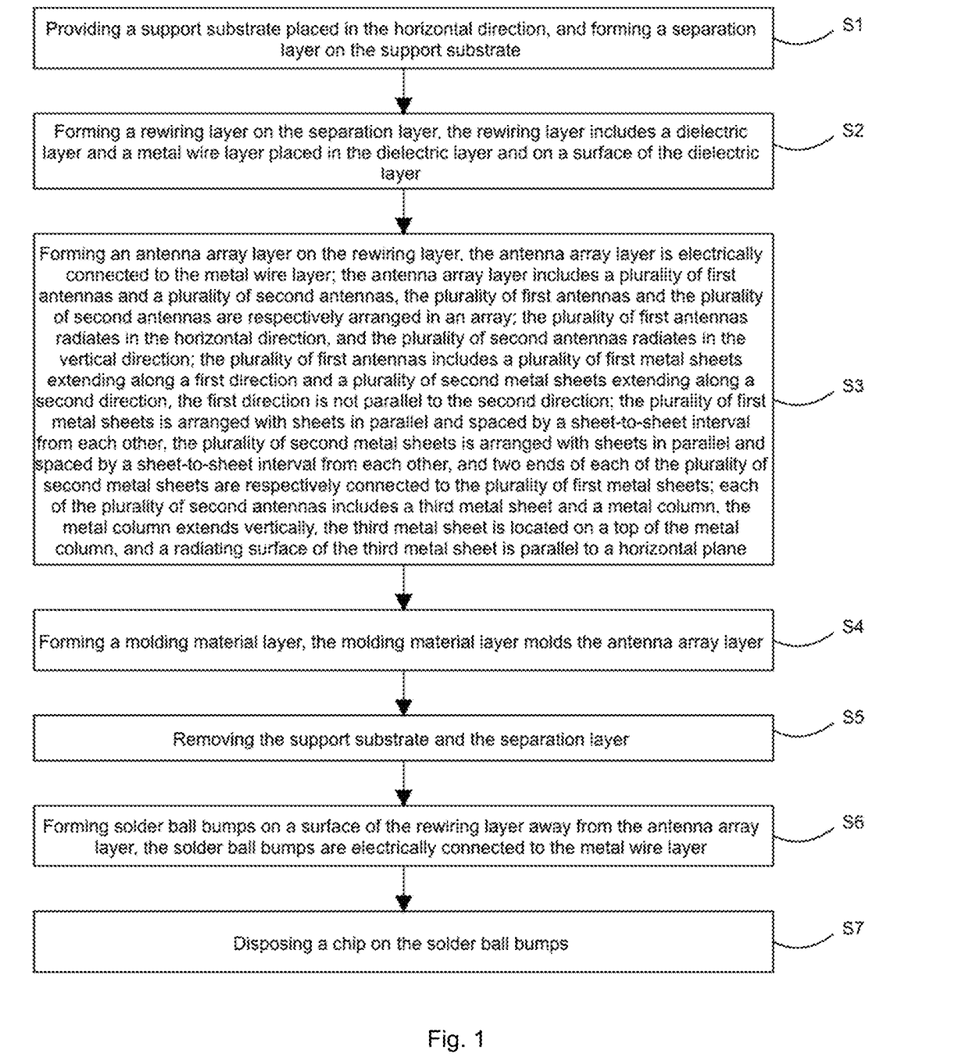
FIG. 1 shows a schematic flowchart of a method for manufacturing an antenna packaging structure radiating e-m waves in both a horizontal direction and a vertical direction and a method making the same according to the present disclosure.
Figure 2:
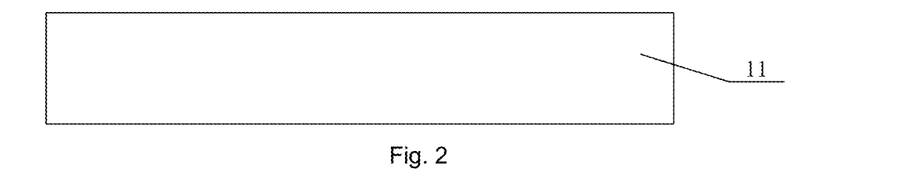
FIGS. 2-11 show schematic views of the structures after each step of the manufacturing process according to the manufacturing method of FIG. 1 of the present disclosure, FIG. 10 and FIG. 11 also show schematic cross-sectional views of the antenna packaging structure radiating e-m waves in a horizontal direction and a vertical direction according to the present disclosure.
Figure 3:
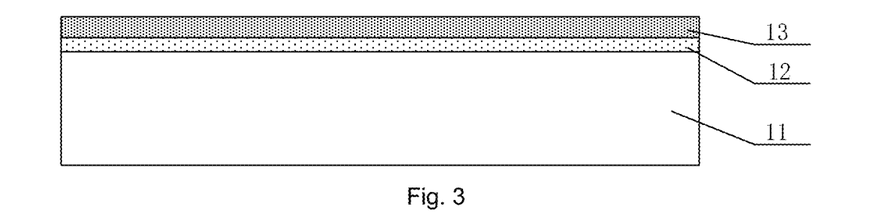

Specifically, referring to FIG. 1, the present disclosure provides a method for making an antenna packaging structure radiating e-m waves in a horizontal direction and a vertical direction, and the method includes:

S1: Providing a support substrate 11, forming a separation layer on the support substrate 11, and the obtained structure is shown in FIGS. 2 and 3.

Figure 4:
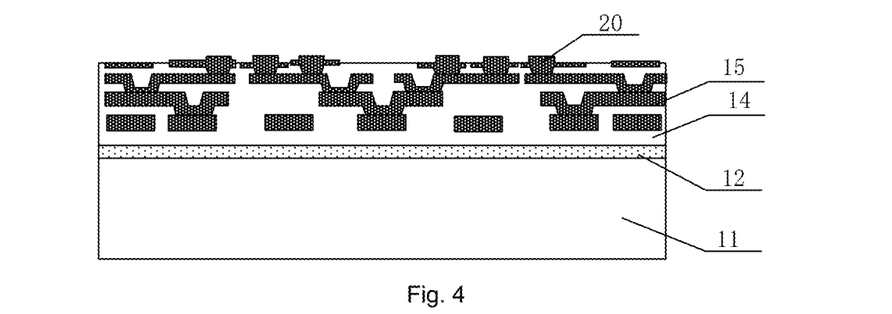
Figure 5:
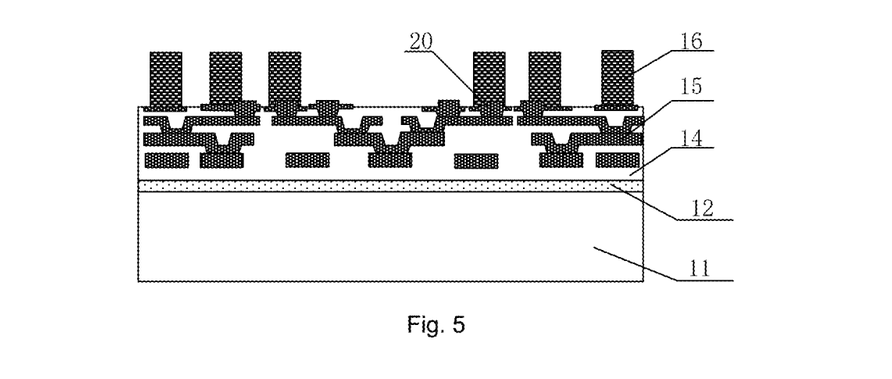

S2: Forming a rewiring layer on the separation layer, the rewiring layer includes a dielectric layer 14 and a metal wire layer 15 placed in the dielectric layer 14 and on a surface of the dielectric layer 14, and the obtained structure is shown in FIG. 4.

Figure 7:
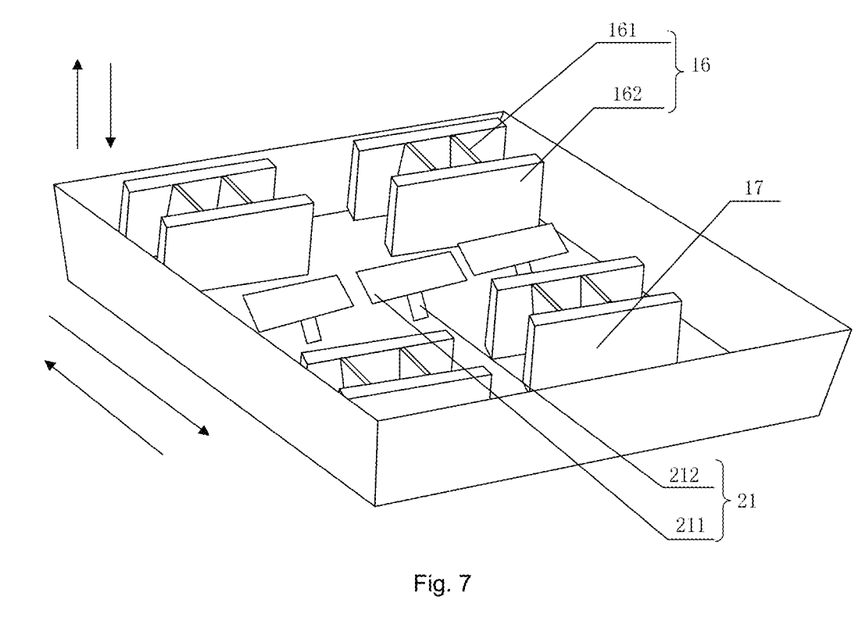

S3: Forming an antenna array layer on the rewiring layer, as shown in FIG. 7, and the antenna array layer is electrically connected to the metal wire layer 15 (the metal wire layer 15 is used as an antenna feeder); the antenna array layer includes a plurality of first antennas 16 and a plurality of second antennas 21, and the plurality of first antennas 16 and the plurality of second antennas 21 are respectively arranged in an array; the plurality of first antennas 16 radiates in the horizontal direction, and the plurality of second antennas 21 radiates in the vertical direction; the plurality of first antennas 16 includes a plurality of first metal sheets 161 extending along a first direction and a plurality of second metal sheets 162 extending along a second direction, and the first direction is not parallel to the second direction; the plurality of first metal sheets 161 is arranged with sheets in parallel and spaced by a sheet-to-sheet interval from each other, the plurality of second metal sheets 162 is arranged in with sheets in parallel and spaced by a sheet-to-sheet interval from each other, and two ends of each of the plurality of second metal sheets 162 are respectively connected to the plurality of first metal sheets 161; each of the plurality of second antennas 21 includes a third metal sheet 211 and metal columns 212, the metal columns 212 extends longitudinally, the third metal sheet 211 is located on the top of the metal columns 212 and is electrically connected to the metal columns 212, and the radiating surface of the third metal sheet 211 is parallel to the horizontal plane of the top surface of the packaging structure (referring to FIG. 7).

Figure 6:
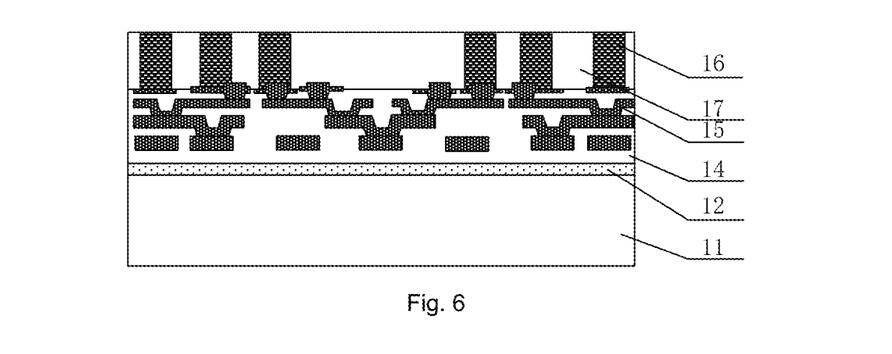

S4: Forming a molding material layer 17, the molding material layer 17 packages the antenna array layer, and the obtained structure is shown in FIG. 6.

Figure 8:
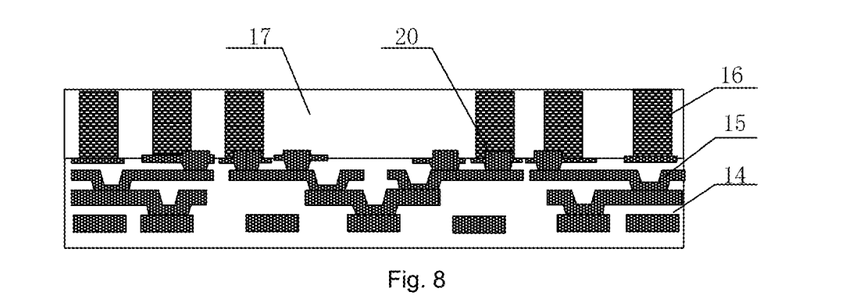

S5: Removing the support substrate 11 and the separation layer, and the obtained structure is shown in FIG. 8.

Figure 9:
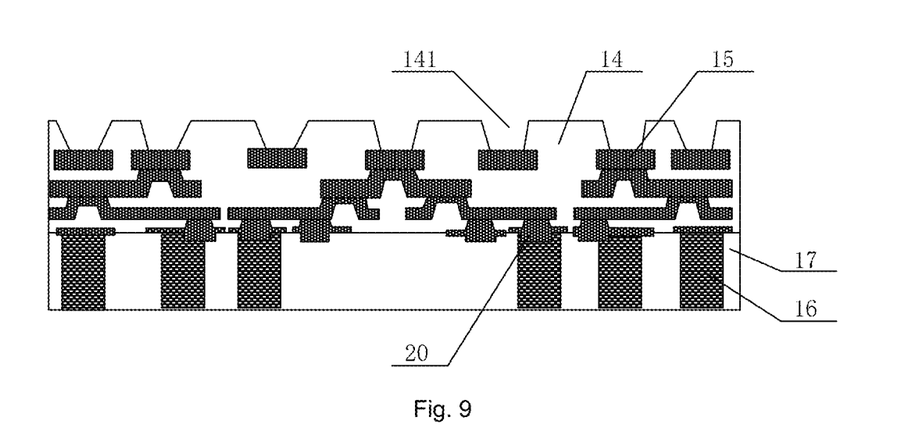

S6: Forming solder ball bumps 18 on a surface of the rewiring layer away from the antenna array layer, the solder ball bumps 18 are electrically connected to the metal wire layer 15, and the obtained structure is shown in FIG. 9.

Figure 10:
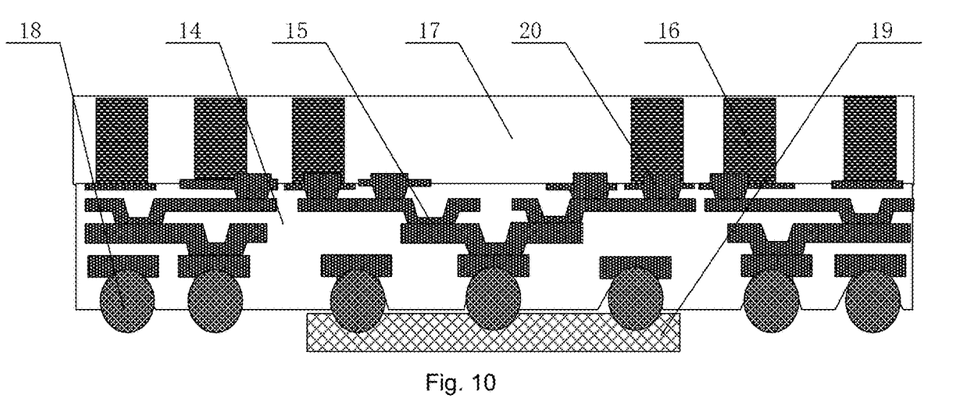
Figure 11:
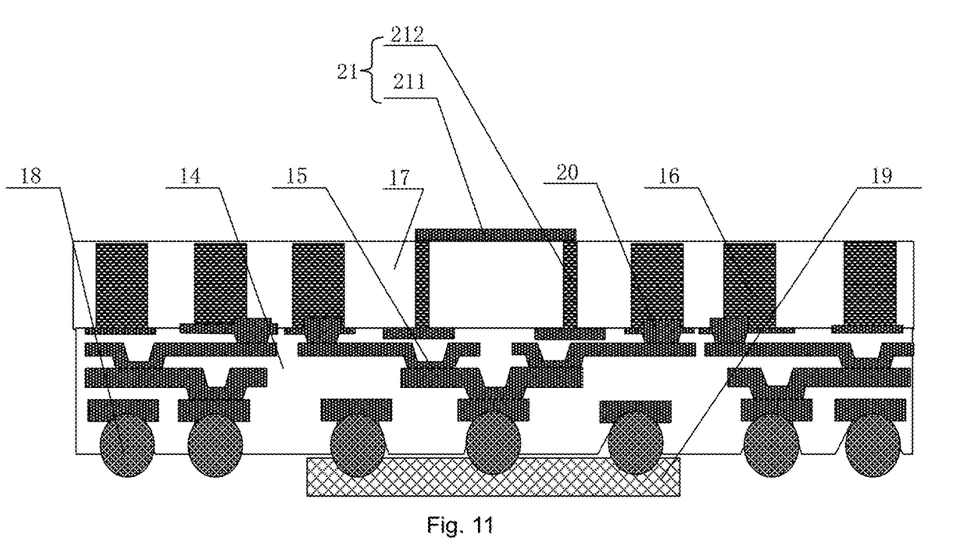

S7: A chip 19 is disposed on the solder ball bumps 18, and the obtained structure is shown in FIGS. 10 and 11, and FIGS. 10 and 11 are schematic cross-sectional views from two different positions.

In the present disclosure, the antennas radiating e-m waves in the horizontal and vertical directions are integrally designed at the same time, so that the antennas can radiate along the side and front of the package at the same time, the radiation wavelength of the antenna can be increased, which can improve the flexibility of antenna design and help improve device performance. Compared with the traditional device with only one vertical radiation direction, the disclosed configuration can reduce the thickness of the molding material layer under the condition of achieving the equal performance, which is conducive to further miniaturization of the device.

The support substrate 11, as its name implies, plays a supporting role to avoid defects such as bending and deformation during the fabrication of the device. As an example, the support substrate includes, but not limited to, a glass substrate, a silicon substrate, a sapphire substrate, a ceramic substrate, a metal substrate, and other materials that have a certain hardness and are not prone to bending deformation. In this embodiment, a transparent substrate such as a quartz glass substrate is preferred, which helps to irradiate the back side of the support substrate 11 with UV light when peeling off the separation layer, so that the support substrate 11 is peeled off from the separation layer. Before preparing the separation layer, the support substrate 11 may be cleaned and dried.

In one example, the separation layer includes a release layer 12 and a protective layer 13, the release layer 12 is formed on a surface of the support substrate 11, and the protective layer 13 is formed on a surface of the release layer 12 facing away from the support substrate 11 for protecting the release layer 12. In other examples, the separation layer may only include the release layer 12. In a further example, the release layer 12 includes but not limited to one or more of a carbon material layer, a resin material layer, and an organic material layer, and the protective layer 13 includes but not limited to a polyimide layer. For example, the support substrate 11 may be a transparent substrate such as a UV transmitting glass substrate, and the release layer 12 may be a UV resin layer. During the subsequent peeling process, the release layer 12 can peel off after being irradiated from the back side of the support substrate 11. In some embodiments, the release layer 12 may be a light-to-heat conversion (LTHC) layer, and the LTHC layer may be heated by a laser in subsequent steps, so that the support substrate 11 is separated from the LTHC layer, thereby reducing the difficulty of the peeling process, and preventing device damage. The formation methods of the release layer 12 and the protective layer 13 can be determined according to their materials. For example, the formation methods may include spin coating, spray coating, and direct attachment.

As an example, the material of the dielectric layer 14 includes, but not limited to, epoxy resin, silica gel, PI, PBO, BCB, silicon oxide, phosphosilicate glass, a combination of one or more of fluorine-containing glass, and other High K dielectric materials. The material of the metal wire layer 15 includes, but not limited to, a combination of one or more metals such as gold, silver, copper, and aluminum. The method for forming the dielectric layer 14 includes, but not limited to, vapor deposition, and the method for forming the metal wire layer 15 includes, but not limited to, a combination of one or more of sputtering, electroplating, and electroless plating. In an example, the process of forming the metal wire layer includes: first forming the dielectric layer 14 on the separation layer, and then forming an opening aligned to the metal wire layer 15 in the dielectric layer 14 by a photolithography process, and then disposing a metal material layer in the opening and on a surface of the dielectric layer 14 to form the metal wire layer 15. Both the dielectric layer 14 and the metal wire layer 15 may have a single-layer or a multi-layer structure, but it is necessary to ensure that the metal wire layers 15 of different layers are electrically connected to each other.

In an example, after the rewiring layer is formed, an under bump metallurgy (UBM) layer may be formed on a surface of the rewiring layer, the UBM layer 20 is electrically connected to the metal wire layer 15, and the antenna array layer is formed on a surface of the UBM layer 20 and is electrically connected to the UBM layer 20. The UBM layer 20 may have a single-layer or a multi-layer structure, and the method for forming the UBM layer 20 includes, but not limited to, one or a combination of sputtering and electroplating. For example, in one example, the UBM layer 20 includes a chromium layer, a chromium-copper (50%-50%) layer, and a copper layer from bottom to top, and a very thin gold layer may be disposed on the top surface of the UBM layer 20 to prevent oxidation of the copper layer. A diffusion layer may be disposed on the bottom of the UBM layer 20. The material of the diffusion layer may include lead-tin alloy, eutectic compound, and other components according to different application requirements, so that the UBM layer 20 is in better electrical contact with the metal wire layer 15.

As an example, the forming of the antenna array layer may include the following operations: forming an antenna metal layer on the rewiring layer by a method including but not limited to some process like sputtering or electroplating, and the material of the antenna metal material layer includes but not limited to a single metal or metal alloy of gold, silver, copper, etc.; coating a photoresist layer on the antenna metal layer, and exposing and developing the photoresist layer to define the position and shape of the plurality of first antennas 16 and the plurality of second antennas 21 in the antenna metal layer; and etching the antenna metal layer to form the antenna array layer.

In an example, as shown in FIG. 7, there are two first metal sheets 161 and two second metal sheets 162 for each antenna, and the first direction is perpendicular to the second direction. The first metal sheets 161 and the second metal sheets 162 both extend in the horizontal direction (the length extending in the horizontal direction is greater than the height extending in the vertical direction), that is, the surfaces with relatively large surface areas (in this embodiment, the surfaces are rectangular surfaces) are perpendicular to the horizontal surface and the widths of the surfaces parallel to the horizontal surface are smaller than the perpendicular ones, for example, less than 5000 nm. The first metal sheets 161 serve as an array to guide and amplify electromagnetic waves, the second metal sheets 162 play the role of radiating electromagnetic waves, the second metal sheets 162 radiate electromagnetic waves outward in the horizontal direction during operation, and the molding material between the metal sheets serves as a medium to propagate the electromagnetic wave radiated from the surface of the second metal sheets 162 along the horizontal direction (for example, the direction indicated by the arrows at the lower left side in FIG. 7). The metal columns 212 of the second antenna 21 serves as an antenna element to guide and amplify the electromagnetic waves, and the third metal sheet 211 radiates the electromagnetic waves outward in the vertical direction during operation. Electromagnetic waves are guided and amplified by the metal columns 212 and are radiated in the vertical direction from the surface of the third metal sheet 211. In other examples, the first antennas and the second antennas may also adopt other structures, which are not strictly limited.

In an example, the plurality of the first antennas 16 is arranged in multiple rows and columns (for example, a 2×2 array), and the plurality of second antennas 21 is arranged in a straight line (that is, a single-row multiple-column structure or a multiple-row single-column structure), which can further improve the antenna performance. In a further example, the array of the second antennas 21 is located in the middle of the array of the first antennas 16, which helps to stabilize the device structure and improve the device performance.

As an example, the method of forming the molding material layer 17 includes, but not limited to, one or more of compression molding, transfer molding, liquid sealing molding, vacuum lamination, and spin coating, and the material of the molding material layer 17 may include one or more of polyimide, silicone, and epoxy. After the molding material layer 17 is formed, the molding material layer 17 may be planarized using grinding or polishing, to facilitate the subsequent process.

After the molding material layer 17 is formed, one or more methods including but not limited to grinding, laser irradiation, heating are used to remove the support substrate 11 and the separation layer according to different materials of the support substrate 11 and the separation layer. If the aforementioned protective layer is formed, the protective layer may be simultaneously removed in this operation.

In one example, after removing the support substrate 11 and the separation layer, openings 141 may be formed in the dielectric layer 14, the openings 141 expose the metal wire layer 15, and the solder ball bumps 18 are formed in the openings 141. For example, the openings 141 are formed by laser etching, and then the solder ball bumps 18 are formed in the openings 141 by a ball mount method, which helps to further ensure good electrical contact between the solder ball bumps 18 and the metal wire layer 15. The material of the solder ball bumps 18 includes, but not limited to, tin, gold, copper, tin alloy, gold alloy, and copper alloy.

As an example, the chip 19 may be bonded to the solder ball bumps 18 by a method including, but not limited to, instantaneous high temperature die bond. The chip 19 includes, but not limited to, various active and passive elements, such as a power device, resistor, capacitor, etc. The chip 19 may be a single chip or multiple chips.

In one example, before or after forming the chip 19, an underfill layer may be formed between the solder ball bumps 18 and the chip 19, to form good protection between the chip 19 and the solder ball bumps 18. For example, after the chip 19 is disposed on the solder ball bumps 18, a sealing epoxy layer may be formed between the chip 19 and the solder ball bumps 18 by a method including but not limited to capillary filling. Or before disposing the chip 19 on the solder ball bumps 18, an underfill layer is formed on the surfaces of the solder ball bumps 18 and between the solder ball bumps 18, and then the underfill layer is etched by laser to form openings for exposing the solder ball bumps 18, and then the chip 19 is soldered to the surfaces of solder ball bumps 18 via these openings.

The present disclosure further provides an antenna packaging structure radiating e-m waves in a horizontal direction and a vertical direction. The antenna packaging structure can be prepared by the method described in any of the foregoing solutions. The antenna packaging structure can also be prepared based on other methods, which will not be described here.

Specifically, as shown in FIG. 10, the antenna packaging structure radiating e-m waves in a horizontal direction and a vertical direction includes a rewiring layer, an antenna array layer, a molding material layer, solder ball bumps, and a chip.

The rewiring layer includes a first surface and a second surface opposite to the first surface, and the rewiring layer includes a dielectric layer 14 and a metal wire layer 15 placed in the dielectric layer 14 and on a surface of the dielectric layer 14.

The antenna array layer is placed on the first surface of the rewiring layer, the antenna array layer is electrically connected to the metal wire layer 15 (the metal wire layer serves as an antenna feeder). The antenna array layer includes a plurality of first antennas 16 and a plurality of second antennas 21, and the plurality of first antennas 16 and the plurality of second antennas 21 are respectively arranged in an array. The plurality of first antennas 16 radiates in the horizontal direction, and the plurality of second antennas 21 radiates in the vertical direction. The plurality of first antennas 16 includes a plurality of first metal sheets 161 extending along a first direction and a plurality of second metal sheets 162 extending along a second direction, and the first direction is not parallel to the second direction. The plurality of first metal sheets 161 is arranged with sheets in parallel and spaced by a sheet-to-sheet interval from each other, the plurality of second metal sheets 162 is arranged in parallel and spaced by an interval from each other, and two ends of each of the plurality of second metal sheets 162 are respectively connected to the plurality of first metal sheets 161. Each of the plurality of second antennas 21 includes third metal sheets 211 and metal columns 212, the metal columns 212 extends longitudinally, the third metal sheets 211 is located on a top of the metal columns 212 and is electrically connected to the metal columns 212, and radiating surfaces of the third metal sheets 211 are parallel to a horizontal plane.

The molding material layer 17 is placed on the first surface of the rewiring layer, and completely or partially molds the antenna array layer. For example, the second antennas may be exposed on the surface of the molding material layer and the first antennas may be covered by the molding material layer.

Solder ball bumps 18 are placed on the second surface of the rewiring layer and electrically connected to the metal wire layer 15.

The chip 19 is electrically connected to the solder ball bumps 18.

As an example, the dielectric layer 14 includes, but not limited to, one or more of an epoxy resin layer, a silica gel layer, a polyimide (PI) layer, a polyphenylene benzoxazole (PBO) layer, a benzocyclobutene (BCB) layer, a silicon oxide layer, a phosphosilicate glass layer, a fluorine-containing glass layer; The metal wire layer 15 includes, but not limited to, one or more of a gold layer, a silver layer, a copper layer, and an aluminum layer.

As an example, the material of the antenna 16 includes, but not limited to, a single metal or metal alloy of gold, silver, and copper.

In an example, the antenna packaging structure radiating e-m waves in a horizontal direction and a vertical direction further includes an under bump metallurgy layer 20, the under bump metallurgy layer 20 is placed on the second surface of the rewiring layer, and two ends of the under bump metallurgy 20 are respectively electrically connected to the metal wiring layer 15 and the solder ball bumps 18. In one example, the under bump metallurgy layer 20 includes a chromium layer, a chromium-copper (50%-50%) layer, and a copper layer from bottom to top.

In an example, the antenna packaging structure radiating e-m waves in a horizontal direction and a vertical direction further includes an underfill layer, and the underfill layer is placed between the chip 19 and the solder ball bumps 18.

As an example, there are two first metal sheets 161 and two second metal sheets 162. And as an example, the first direction is perpendicular to the second direction. The surfaces of the first metal sheets 161 and the second metal sheets 162 perpendicular to the horizontal plane are rectangular surfaces with areas larger than the areas of the respective surfaces of the first metal sheets 161 and the second metal sheets 162 parallel to the horizontal plane. Or it can also be described as, the first metal sheets 161 and the second metal sheets 162 each include a first surface and a second surface perpendicular to the first surface, the first surface is parallel to the horizontal plane, the second surface is perpendicular to the horizontal plane, and the area of the second surface is larger than the area of the first surface. That is, the first metal sheets 161 and the second metal sheets 162 are both thin plates, and the lengths of both are greater than their height and width. The radiating surfaces of the third metal sheets may also be rectangular surfaces, and the materials of the first antennas and the second antennas are preferably the same.

In an example, the plurality of first antennas 16 is arranged in multiple rows and columns (for example, a 2×2 array), and the plurality of second antennas 21 is arranged in a straight line (that is, a single-row multiple-column structure or a multiple-row single-column structure), which can further improve the antenna performance. In a further example, the array of the second antennas 21 is located in the middle of the array of the first antennas 16, which helps to stabilize the device structure and improve the device performance.

By arranging antennas radiating e-m waves in the horizontal and vertical directions respectively (that is, the antenna may radiate from the side and front directions of the package), the flexibility of the antenna design can be improved and the device performance can be improved. Compared with the traditional device with antennas radiating e-m waves in the vertical direction, the present disclosure can reduce the thickness of the molding material layer under the condition of achieving the same device performance, which is helpful to further reduce the size of the device.

In summary, the present disclosure provides an antenna packaging structure radiating e-m waves in a horizontal direction and a vertical direction and a method making the same. The method includes: providing a support substrate, and forming a separation layer on the support substrate; forming a rewiring layer on the separation layer, the rewiring layer includes a dielectric layer and a metal wire layer placed in the dielectric layer and on a surface of the dielectric layer; forming an antenna array layer on the rewiring layer, the antenna array layer is electrically connected to the metal wire layer; the antenna array layer includes a plurality of first antennas and a plurality of second antennas, the plurality of first antennas and the plurality of second antennas are respectively arranged in an array; the plurality of first antennas radiates in the horizontal direction, and the plurality of second antennas radiates in the vertical direction; the plurality of first antennas includes a plurality of first metal sheets extending along a first direction and a plurality of second metal sheets extending along a second direction, the first direction is not parallel to the second direction; the plurality of first metal sheets is arranged with sheets in parallel and spaced by a sheet-to-sheet interval from each other, the plurality of second metal sheets is arranged with sheets in parallel and spaced by a sheet-to-sheet interval from each other, and two ends of each of the plurality of second metal sheets are respectively connected to the plurality of first metal sheets; each of the plurality of second antennas includes a third metal sheet and a metal column, the metal column extends longitudinally, the third metal sheet is located on a top of the metal column, and a radiating surface of the third metal sheet is parallel to a horizontal plane; forming a molding material layer, the molding material layer molds the antenna array layer; removing the support substrate and the separation layer; forming solder ball bumps on a surface of the rewiring layer away from the antenna array layer, the solder ball bumps are electrically connected to the metal wire layer; and disposing a chip on the solder ball bumps. In the present disclosure, the antennas radiating e-m waves in the horizontal and vertical directions are designed at the same time, so that the antennas can radiate along the side and front of the package at the same time, the radiation wavelengths of the antennas can be increased, which can improve the flexibility of antenna design and help improve device performance. Compared with the traditional device with only a vertical radiation direction, the present disclosure can reduce the thickness of the molding material layer under the condition of achieving the same performance, which is conducive to further miniaturization of the device.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A method for making an antenna packaging structure radiating e-m waves in a horizontal direction and a vertical direction, the method comprising:
    providing a support substrate placed in the horizontal direction, and forming a separation layer on the support substrate;
    forming a rewiring layer on the separation layer, wherein the rewiring layer includes a dielectric layer and a metal wire layer placed in the dielectric layer and on a surface of the dielectric layer;
    forming an antenna array layer on the rewiring layer,
        wherein the antenna array layer is electrically connected to the metal wire layer,
        wherein the antenna array layer comprises a plurality of first antennas and a plurality of second antennas,
            wherein the plurality of first antennas and the plurality of second antennas are respectively arranged in an array,
            wherein the plurality of first antennas radiates in the horizontal direction,
            wherein the plurality of second antennas radiates in the vertical direction,
            wherein the plurality of first antennas comprises a plurality of first metal sheets extending along a first direction and a plurality of second metal sheets extending along a second direction,
                wherein the first direction is not parallel to the second direction;
            wherein the plurality of first metal sheets is arranged with sheets in parallel and spaced by a sheet-to-sheet interval from each other,
            wherein the plurality of second metal sheets is arranged with sheets in parallel and spaced by a sheet-to-sheet interval from each other,
            wherein two ends of each of the plurality of second metal sheets are respectively connected to the plurality of first metal sheets, and
            wherein each of the plurality of second antennas comprises a third metal sheet and a metal column,
                wherein the metal column extends vertically,
                wherein the third metal sheet is located on a top of the metal column, and
                wherein a radiating surface of the third metal sheet is parallel to a horizontal plane;
    forming a molding material layer, wherein the molding material layer molds the antenna array layer;
    removing the support substrate and the separation layer;
    forming solder ball bumps on a surface of the rewiring layer away from the antenna array layer, wherein the solder ball bumps are electrically connected to the metal wire layer; and
    disposing a chip on the solder ball bumps.

2. The method for making the antenna packaging structure radiating e-m waves in the horizontal radiation direction and the vertical direction according to claim 1, wherein after removing the support substrate and the separation layer, the method further comprises: forming openings in the dielectric layer, wherein the openings expose the metal wire layer, and forming the solder ball bumps in the openings.

3. The method for making the antenna packaging structure radiating e-m waves in the horizontal radiation direction and the vertical direction according to claim 1, wherein two of the plurality of first metal sheets and two of the plurality of second metal sheets are provided in the antenna array layer, and wherein the first direction is perpendicular to the second direction.

4. The method for making the antenna packaging structure radiating e-m waves in the horizontal radiation direction and the vertical direction according to claim 1, wherein the support substrate comprises a glass substrate; wherein the separation layer comprises a release layer and a protective layer, wherein the release layer is formed on a surface of the support substrate, and the protective layer is formed on a surface of the release layer facing away from the support substrate; wherein the release layer comprises one or more of a carbon material layer, a resin material layer, and an organic material layer, and wherein the protective layer comprises a polyimide layer.

5. The method for making the antenna packaging structure radiating e-m waves in the horizontal radiation direction and the vertical direction according to claim 1, wherein after the rewiring layer is formed, the method further comprises: forming an under bump metallurgy (UBM) layer on the surface of the rewiring layer, wherein the UBM layer is electrically connected to the metal wire layer, and wherein the antenna array layer is formed on a surface of the UBM layer and is electrically connected to the UBM layer.

6. An antenna packaging structure radiating e-m waves in a horizontal direction and a vertical direction, wherein the antenna packaging structure comprises:
    a rewiring layer, comprising a first surface and a second surface opposite to the first surface, wherein the rewiring layer comprises a dielectric layer and a metal wire layer placed in the dielectric layer and on a surface of the dielectric layer;
    an antenna array layer, placed on the first surface of the rewiring layer, wherein
        wherein the antenna array layer is electrically connected to the metal wire layer,
        wherein the antenna array layer comprises a plurality of first antennas and a plurality of second antennas,
            wherein the plurality of first antennas and the plurality of second antennas are respectively arranged in an array,
            wherein the plurality of first antennas radiates in the horizontal direction,
            wherein the plurality of second antennas radiates in the vertical direction,
            wherein the plurality of first antennas comprises a plurality of first metal sheets extending along a first direction and a plurality of second metal sheets extending along a second direction, wherein
                wherein the first direction is not parallel to the second direction;
                wherein the plurality of first metal sheets is arranged with sheets in parallel and spaced by a sheet-to-sheet interval from each other,
                wherein the plurality of second metal sheets is arranged with sheets in parallel and spaced by a sheet-to-sheet interval from each other, and
                wherein two ends of each of the plurality of second metal sheets are respectively connected to the plurality of first metal sheets, and
            wherein each of the plurality of second antennas comprises a third metal sheet and a metal column, wherein the metal column extends vertically, wherein the third metal sheet is located on a top of the metal column, and wherein a radiating surface of the third metal sheet is parallel to the horizontal plane;
    a molding material layer, placed on the first surface of the rewiring layer, and molding the antenna array layer;
    solder ball bumps, placed on the second surface of the rewiring layer and electrically connected to the metal wire layer; and
    a chip, electrically connected to the solder ball bumps.

7. The antenna packaging structure radiating e-m waves in the horizontal direction and the vertical direction according to claim 6, wherein the antenna packaging structure further comprises an under bump metallurgy layer, wherein the under bump metallurgy layer is placed on the second surface of the rewiring layer, and two ends of the under bump metallurgy are respectively connected electrically to the metal wiring layer and the solder ball bumps.

8. The antenna packaging structure radiating e-m waves in the horizontal direction and the vertical direction according to claim 6, the antenna packaging structure further comprising an underfill layer, wherein the underfill layer is placed between the chip and the solder ball bumps.

9. The antenna packaging structure radiating e-m waves in the horizontal direction and the vertical direction according to claim 6, wherein two of the plurality of first metal sheets and two of the plurality of second metal sheets are provided, and wherein the first direction is perpendicular to the second direction.

10. The antenna packaging structure radiating e-m waves in the horizontal direction and the vertical direction according to claim 6, wherein the plurality of first antennas is arranged in multiple rows and multiple columns, wherein the plurality of second antennas is arranged in lines between the plurality of first antennas.

\* \* \* \* \*